(12) United States Patent
Rumney

(10) Patent No.: US 6,856,512 B2
(45) Date of Patent: Feb. 15, 2005

(54) U-SEAM

(75) Inventor: Gary S. Rumney, Leighton Buzzard (GB)

(73) Assignee: Sun Microsystems, Inc., Santa Clara, CA (US)

( * ) Notice: Subject to any disclaimer, the term of this patent is extended or adjusted under 35 U.S.C. 154(b) by 103 days.

(21) Appl. No.: 10/145,954

(22) Filed: May 15, 2002

(65) Prior Publication Data

US 2003/0216084 A1 Nov. 20, 2003

(51) Int. Cl.⁷ .............................................. H05K 5/03
(52) U.S. Cl. ...................... 361/725; 361/724; 361/727
(58) Field of Search ................................ 361/724, 725, 361/727; 312/223.1–223.3

(56) References Cited

U.S. PATENT DOCUMENTS

| | | |
|---|---|---|
| 5,398,833 A | 3/1995 | Klauss et al. |
| 6,550,877 B1 * | 4/2003 | Anderson et al. ........ 312/223.2 |

FOREIGN PATENT DOCUMENTS

| | | |
|---|---|---|
| EP | 0129883 | 6/1984 |
| EP | 129883 | 1/1985 |
| EP | 419949 | 4/1991 |
| GB | 2223359 | 4/1990 |
| GB | 2285388 | 7/1995 |
| WO | 99/20092 | 4/1999 |

OTHER PUBLICATIONS

"Thin Electronics Bay Specification, A Server System Infrastructure (SSI) Specification for Thin Servers, Version 1.0", Intel Corporation, et al, 2001, 2002.
"Thin Electronics Bay Specification, A Server System Infrastructure (SSI) Specification for Thin Servers, Version 1.1", Intel Corporation, et al, 2002.

* cited by examiner

Primary Examiner—Yean-Hsi Chang
(74) Attorney, Agent, or Firm—Meyertons Hood Kivlin Kowert & Goetzel, P.C.; B. Noël Kivlin

(57) ABSTRACT

The present invention provides a U-seam for coupling a panel to an electronics bay. The U-seam includes a top element, a side element, and a base element coupled to the top element through the side element, wherein the top element and the base element are spaced apart to form a gap therebetween, and wherein the gap is adapted to receive a portion of a first panel and to reduce the amount of electromagnetic interference passing between the portion of the first panel and the top, the side, and the base elements.

23 Claims, 4 Drawing Sheets

U-SEAM

BACKGROUND OF THE INVENTION

1. Field of the Invention

This invention relates generally to an electronic bay, and, more particularly, to forming U-seams at openings in the electronic bay.

2. Description of the Related Art

Servers may be used for a variety of applications including, but not limited to, audio-visual streaming, managing a network, detecting viruses, and providing a web or mail server. A server may include such components as a power supply, a printed circuit board, a cooling fan, a peripheral component interface, and the like, which may be deployed in an electronics bay. In one embodiment, the electronics bay may include a top panel and a bottom panel that may be coupled to a front panel, a back panel, and two side panels. An opening in the back panel may allow components to be placed in the electronics bay and a cover may be provided to close the opening.

The Server System Infrastructure (SSI, www.ssiforum.org) specification for Thin Servers adopted by such manufacturers as Sun Microsystems, Compaq, Dell, DataGeneral, NEC, Intel, IBM, and Silicon Graphics, defines a one-unit (1U) and two-unit (2U) server electronics bay. According to the SSI specification, the front and back panels of the 1U server electronics bay may each have a vertical dimension of at most 43.2 millimeters and a horizontal dimension of at most 445.0 millimeters. Similarly, the front and back panels of the 2U server electronics bay may each have a vertical dimension of at most 85.9 millimeters and a horizontal dimension of at most 445.0 millimeters.

Depending on demand for the various applications, it may be desirable to deploy a plurality of servers to handle different tasks. To conserve space, the plurality of servers may be deployed in a server system rack, such as an Internet data center rack and the like. The components in the electronics bay may produce electromagnetic interference, such as radio frequency waves and the like. The electromagnetic interference may undesirably affect the operation of other devices, including components in other electronic bays that may be deployed in the server system rack.

To reduce the intensity of the electromagnetic interference that may leak out of the electronics bay, the back panel may be coupled to the electronics bay by a folded U-seam. For example, and as shown in FIG. 1, the SSI specification suggests forming the folded U-seam 100 by folding an approximately 1-millimeter-thick metal sheet 110 to provide an approximately 2-millimeter wide opening 120. A back panel 130 may be coupled to the electronics bay by positioning a portion 135 of the back panel 130 in the opening 120.

However, forming the folded U-seam as suggested by the SSI specification may be difficult with current tools. And even if the folded U-seam may be formed, the folded U-seam may be undesirably thick and may thus limit the area of the back panel 130 that may be available for openings 120 that may provide access to the components in the electronics bay. For example, the folded U-seam may make it difficult to access double-sided printed circuit boards that may be used in the server.

SUMMARY OF THE INVENTION

In one aspect of the instant invention, a U-seam is provided for coupling a panel to an electronics bay. The apparatus includes a top element, a side element, and a base element coupled to the top element through the side element, wherein the top element and the base element are spaced apart to form a gap therebetween, and wherein the gap is adapted to receive a portion of a first panel and to reduce the amount of electromagnetic interference passing between the portion of the first panel and the top, the side, and the base elements.

In one aspect of the present invention, a method is provided for coupling a panel to an electronics bay. The method includes forming a U-seam including a top element and a base element coupled to the top element through a side element, wherein the U-seam is adapted to receive a portion of a first panel and to reduce the amount of electromagnetic interference passing through the opening. The method further includes forming a tab coupled to the base element.

BRIEF DESCRIPTION OF THE DRAWINGS

The invention may be understood by reference to the following description taken in conjunction with the accompanying drawings, in which like reference numerals identify like elements, and in which.

Figure 1:
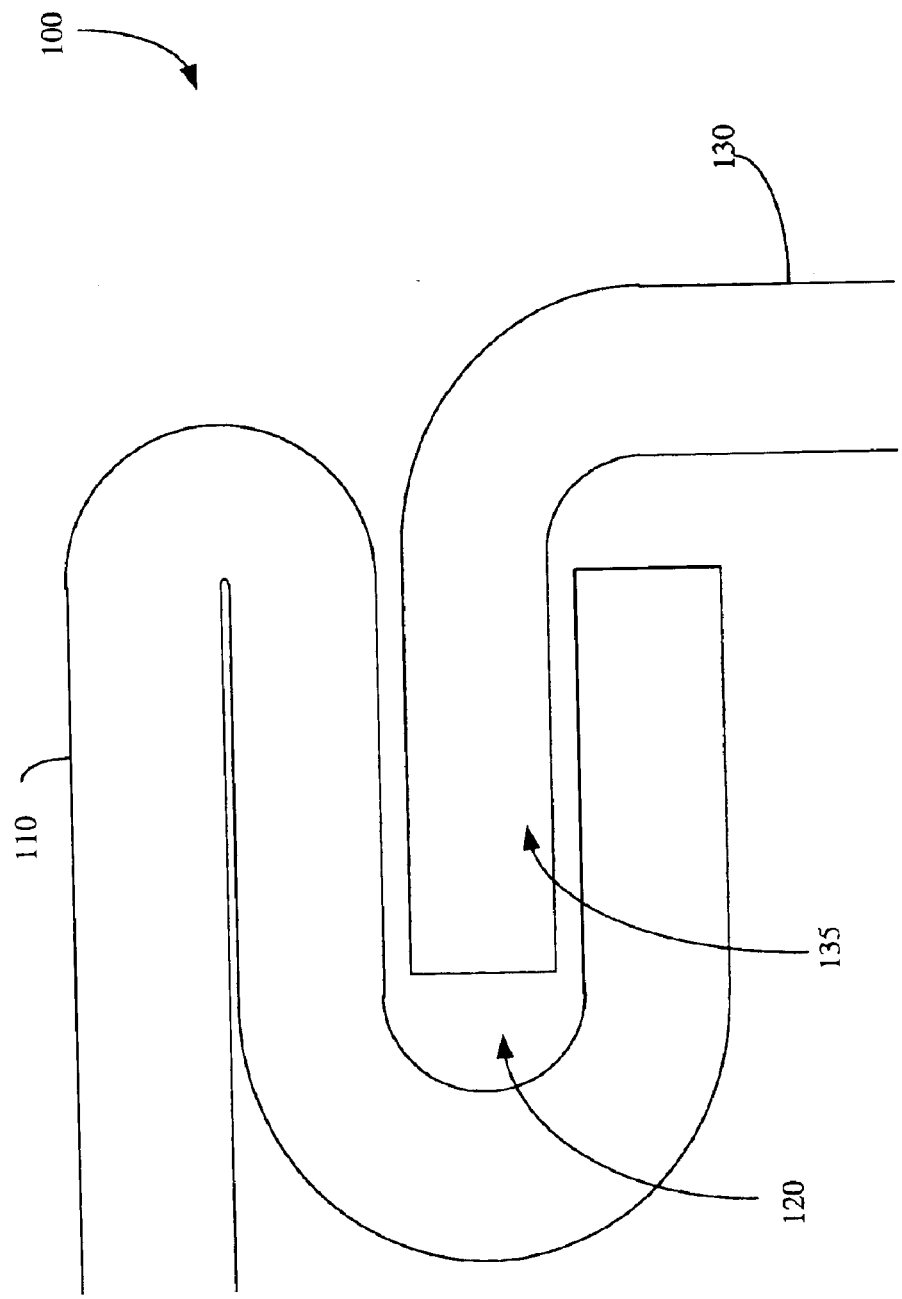
FIG. 1 shows a block diagram of a prior art folded U-seam.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
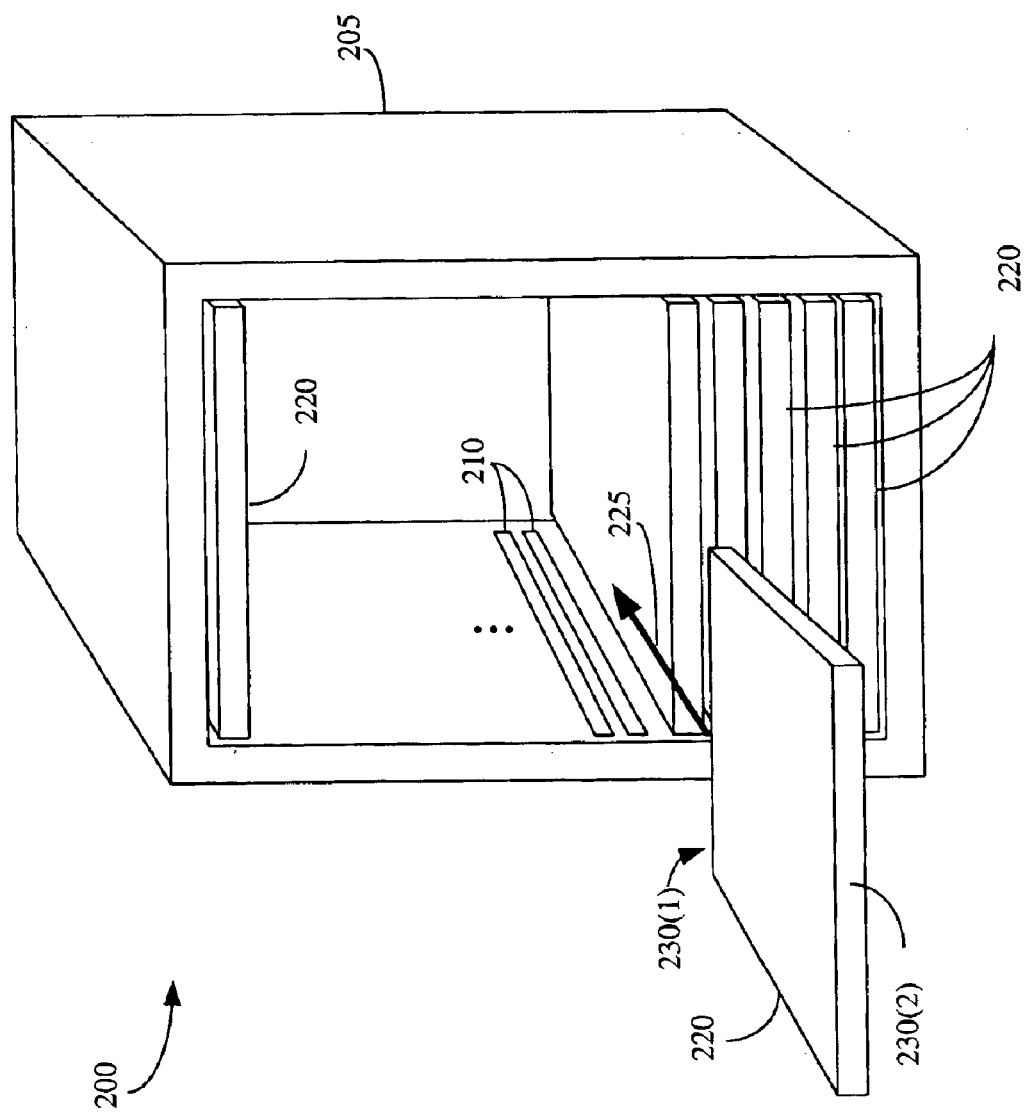
FIG. 2 shows a block diagram of a server system including a plurality of bays, in accordance with one embodiment of the present invention.

Referring now to FIG. 2, a stylized diagram of a server system 200 is shown. In one embodiment, the server system 200 may include a server system rack 205. Although not so limited, the server system rack 205 may be a 19-inch rack, a 23-inch rack, a 24-inch rack, a 600-millimeter rack, and the like. For example, the server system rack may be a SunFire® server system rack. The server system rack 205 may include a plurality of mounting elements 210 such as rails, guides, grooves, hooks, and the like. In one embodiment, a plurality of bays 220 may be positioned in the server system rack 205 by coupling the bays 220 to the mounting elements 210. For example, the bays 220 may be positioned in the server system rack 205 by inserting the bay 220 into the server system rack 205 along the direction indicated by an arrow 225.

Although not so limited, the bays 220 may be electronics bays 220 that conform to the Server System Infrastructure (SSI) specification for Thin Servers, which defines a one-unit (1U) and two-unit (2U) configuration of the electronics bay 220. In one embodiment, the bay 220 may include a variety of electronic components that may perform a variety of functions. For example, the bay 220 may be a Sun Netra™ X1 Server, which may be used to perform functions such as audio-visual streaming, managing a network, detecting viruses, providing a web or mail server, and the like.

According to the SSI specification, a front panel 230(1) and a back panel 230(2) of the 1U server electronics bay 220 may each have a vertical dimension of at most 43.2 millimeters and a horizontal dimension of at most 445.0 millimeters. According to the SSI specification, the front panel 230(1) and the back panel 230(2) of the 2U server electronics bay 220 may each have a vertical dimension of at most 85.9 millimeters and a horizontal dimension of at most 445.0 millimeters. It should, however, be noted that the front and back panels 230(1-2) may be formed in dimensions that may be different than the dimensions recited above without deviating from the scope of the present invention. In alternative embodiments, the front and back panels 230(1-2) may have a vertical dimension of more than 43.2 millimeters and a horizontal dimension of more than 445.0 millimeters.

It may be desirable to periodically add components to the bay 220 and/or remove components from the bay 220. For example, the functionality of the components in the bay 220 may be upgraded by removing an old printed circuit board and adding a new printed circuit board. Thus, an opening (not shown) may be provided in the back panel 230(2) and a cover (not shown) may be provided to secure the opening, in accordance with one embodiment of the present invention.

Components in the bays 220 may, in one embodiment, produce electromagnetic interference. For example, a power supply (not shown) in the bay 220 may produce radio frequency waves. The electromagnetic interference may disrupt the operation of other electronic devices, such as the components in other bays 220 of the server system 200. Thus, in accordance with one embodiment of the present invention, a U-seam (not shown) may be provided to reduce the amount of electromagnetic interference that may leave the bay 220 through the opening in the back panel 230(2). The U-seam may receive a portion of the cover, as described in more detail below.

Figure 3:
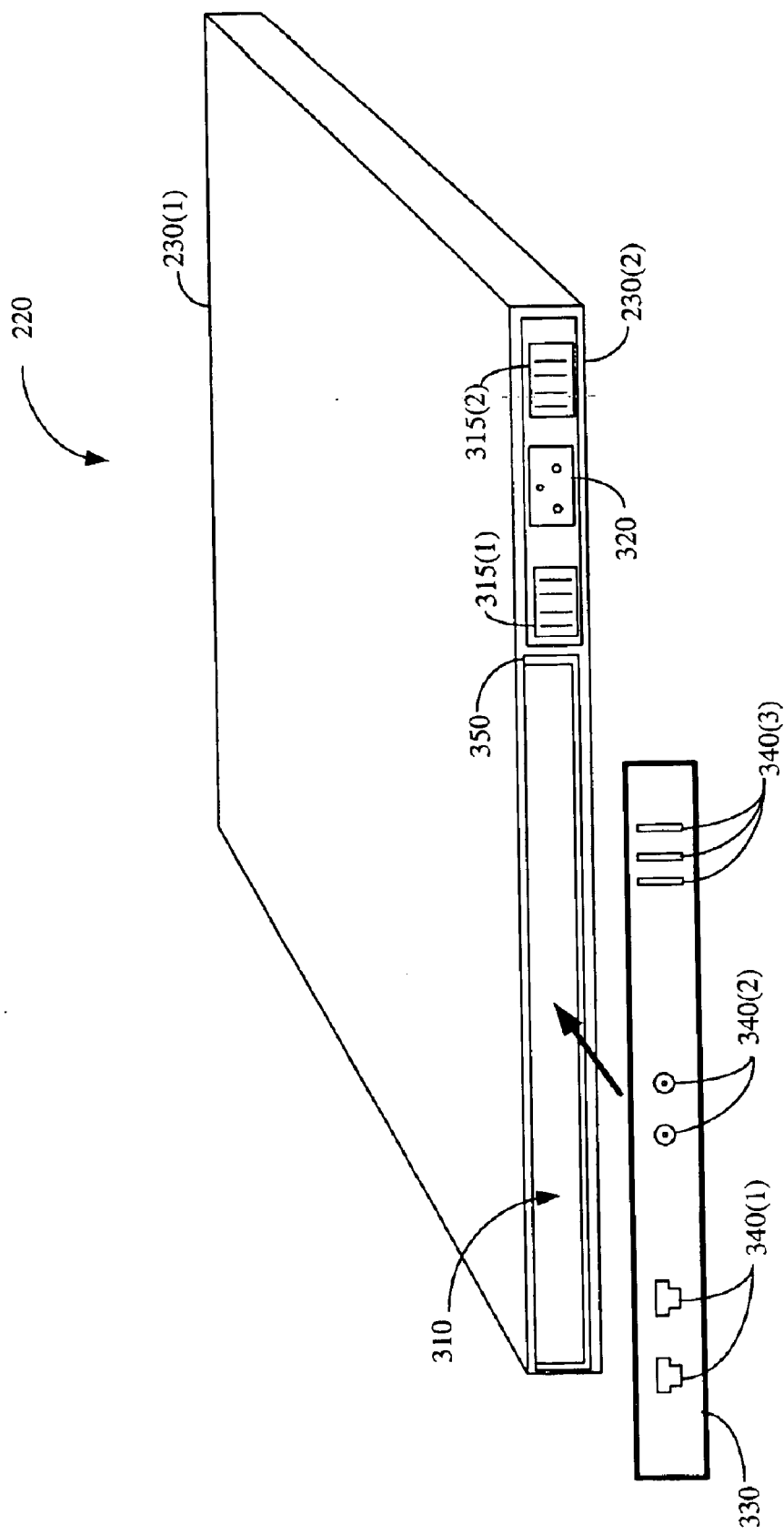
FIG. 3 shows a more detailed block diagram of a bay such as that shown in FIG. 2, in accordance with one embodiment of the present invention.

FIG. 3 shows a block diagram of one embodiment of the bay 220. The back panel 230(2) of the bay 220 may include a variety of openings 310, 315(1-2) and connectors 320. In one embodiment, the opening 310 may be provided to allow one or more components in the bay 220 to be removed, added, or any combination thereof. For example, in one embodiment, a printed circuit board (not shown) may be removed through the opening 310. The openings 315(1-2) may be provided to allow air to flow into and/or out of the bay 220. Although not so limited, the connector 320 may be provided to couple a power cable (not shown) to the bay 220. However, it should be appreciated that, in alternative embodiments, more or fewer openings 310, 315(1-2) and connectors 320 may be provided to allow access to the bay 220 and to form a variety of different couplings to the bay 220. For example, an additional connector 320 may be provided to couple a peripheral component interface (PCI) device to the bay 220.

A cover 330 may be provided to cover the opening 310. In one embodiment, the cover 330 may include a variety of openings 340(1-3) that may provide access to the bay 220. For example, network devices (not shown) such as Internet servers, modems, and the like may be coupled to the bay 220 via cables, wires, and the like (not shown) that may be coupled to the openings 340(1-3). For another example, input/output devices such as audio/visual devices (not shown) and storage devices such as disk and tape drives may similarly be coupled to the bay 220 via cables, wires, and the like that may be coupled to the openings 340(1-3).

A U-seam element 350, described in detail below, may be provided to at least one of the edges of the opening 310. For example, the U-seam element 350 may be provided to three edges of the opening 310. Providing the U-seam element 350 may reduce the amount of electromagnetic interference that may leak out of the bay 220 through the back panel 230(2), in accordance with one embodiment of the present invention.

Figure 4:
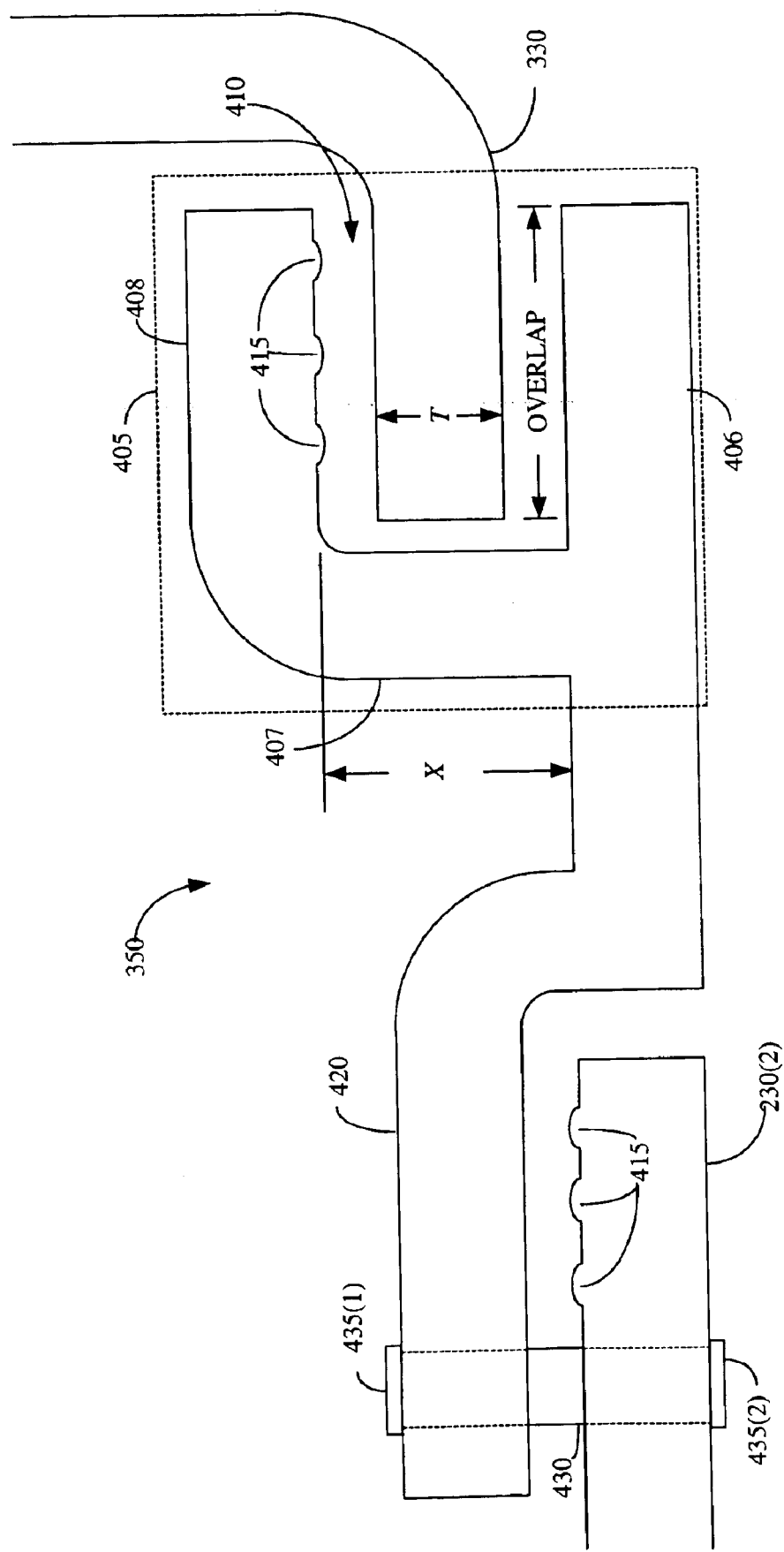
FIG. 4 shows a stylized cross-sectional view of a U-seam that may be used in the bay illustrated in FIG. 3, in accordance with one embodiment of the present invention.

Referring now to FIG. 4, a stylized cross-sectional view of the U-seam element 350, in accordance with one embodiment of the present invention, is shown. Although the various regions and structures of the U-seam element 350 are depicted in FIG. 4 as having very precise, sharp configurations and profiles, those skilled in the art recognize that, in reality, these regions and structures are not as precise as indicated in the drawings. For example, corners depicted as sharp may, in one embodiment, be curved. Additionally, the relative sizes of the various features depicted in the drawings may be exaggerated or reduced as compared to the size of those feature sizes on fabricated U-seams. Nevertheless, the attached drawings are included to describe and explain illustrative examples of the present invention.

The U-seam element 350 may include a U-seam 405, indicated in FIG. 4 by a dashed rectangle, which may include a base 406, a side 407, and a top 408. The base 406, the side 407, and the top 408 may form a gap 410 having a dimension x. A portion of the cover 330 may be inserted in the gap 410. In one embodiment, the top 408 and base 406 may also include features that may aid in inserting the cover 330. For example, the top 408 may include an upturn (not shown) to aid in inserting the cover 330.

The width x of the gap 410 and the overlap between the U-seam 405 and the cover 330 may be chosen so that the amount of electromagnetic interference that may leak out of the back panel 230(2) may be reduced. For example, it may be desirable to reduce the leakage of radio waves at a frequency of about 10 GHz from the bay 220. Thus, in one embodiment, the thickness of the cover 330 may be about T=1 millimeter, the gap 410 may be about x=2 millimeters, and the overlap may be about 6 millimeters. However, it should be appreciated that the thickness of the cover 330, the width of the gap 410, and the overlap are matters of design choice and may have any desirable value. Similarly, in alternative embodiments, it may be desirable to reduce the amount of electromagnetic interference at frequencies that may be higher or lower than 10 GHz.

The base 406, the side 407, and the top 408 may also include a variety of features (not shown) that may further reduce the amount of electromagnetic interference that may leak out of the opening 310. For example, portions of the base 406, the side 407, and the top 408 that face the gap 410 may include one or more dimples 415. In one embodiment, the back panel 230(2) may also include one or more dimples 415 that may reduce the amount of electromagnetic interference that may leak out of the bay 220.

The U-seam element 350 may include a tab 420 that may be coupled to base 406. Although not so limited, in one embodiment, one or more stakes 430 may be us to couple the tab 420 of the U-seam element 350 to a portion of the opening 310 in the back panel 230(2). In one embodiment, the portion of the opening 310 may include a bottom edge and/or one or more side edges (see FIG. 3). Ends 435(1–2) of the one or more stakes 430 may be flared or otherwise shaped such that the stakes 430 may couple the U-seam element 350 to the bottom edge and/or the one or more side edges of the opening 310 (see FIG 3). However, it will be appreciated that, in alternative embodiments, the U-seam element 350 may be coupled to the back panel 230(2) in any desirable manner. For example, rivets, bolts, weld or other fasteners may be used to couple the U-seam element 350 to the back panel 230(2) without departing from the scope of the present invention. Furthermore, while FIG. 4 shows a separation between the tab 420 and the back panel 230(2) invention is not so limited. In alternative embodiments, the tab 420 may be flush with the back panel 230(2).

The U-seam element 350 may be formed by a variety of means well known to those of ordinary skill in the art. In one embodiment, the U-seam element 350 may be formed by extruding a metal through a prefabricated die. For example, aluminium may be extruded to form the U-seam element 350. However, any desirable metal may be used to form the U-seam element 350. In alternative embodiments, the U-seam element 350 may be formed by extruding any material that is near the material used to form the base 406 in galvanic potential difference, as will be appreciated by persons of ordinary skill in the art. For example, the material used to form the U-seam element 350 and the material used to form the base 406 may be separated by no more than 2 positions on the galvanic table.

By forming the U-seam element 350 from the base 406, the side 407, and the top 408 in the manner described above, the width of the U-seam element 350 may be reduced and the area of the back panel 230(2) that may be available for openings may be increased. For example, the height of the back panel 230(2) of the bay 220 may be about 43.2 millimeters. If the thickness of the metal is about 1 millimeter, a traditional folded U-seam 100 (see FIG. 1) may have a height of about 5 millimeters. In contrast, the U-seam element 350 may have a height of about 4 millimeters, which may allow access to a wider variety of components in the bay 220. In one embodiment, the U-seam element 350 may allow access to a double-sided printed circuit board (not shown) that may be deployed in the bay 220. In an alternative embodiment, the printed circuit board (not shown) may be coupled to the cover 330.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a top element;
   a side element;
   a base element coupled to said top element through said side element, wherein the top element and the base element are spaced apart to form a gap therebetween, and herein the gap is adapted to receive a portion of a first panel and to reduce the amount of electromagnetic interference passing between the portion of the first panel and the top, the side, and the base elements;
   a tab coupled to the base element; and
   a bay, wherein the bay is formed of a top panel, a bottom panel, a front panel, a back panel, and two side panels;
   wherein the tab is adapted to couple the base element to a portion of an opening in the bay with at least one of a stake, a rivet, a bolt, and a weld.

2. The apparatus of claim 1, wherein the portion of the first panel includes at least one edge of the first panel.

3. The apparatus of claim 2, wherein the portion of the first panel includes at least three edges of the first panel.

4. The apparatus of claim 1, wherein the opening is in the back panel of the bay.

5. The apparatus of claim 4, wherein the portion of the opening in a second panel includes at least three sides of the opening.

6. The apparatus of claim 1, wherein the portion of the opening in a second panel includes at least one side of the opening.

7. The apparatus of claim 1, wherein the first panel is adapted to cover the opening.

8. The apparatus of claim 1, wherein the top element, the side element, and the base element are formed of a metal, wherein the metal is aluminum.

9. The apparatus of claim 1, wherein the top element, the side element, and the base element are formed a metal, wherein the metal is zinc.

10. The apparatus of claim 1, where the top element, the side element, and the base element are about 1 millimeter thick.

11. The apparatus of claim 1, where the gap is about 2 millimeters thick.

12. An apparatus, comprising:
    an extruded U-seam including a top element and a base element coupled to said top element through a side element, wherein the extruded U-seam is adapted to receive a portion of a first panel and to reduce the amount of electromagnetic interference passing between the portion of the first panel and the top, the side, and the base elements; and
    a tab coupled to the extruded U-seam and adapted to couple the base element to a portion of an opening in an electronics bay with at least one of a stake, a rivet, a bolt, an a weld;
    wherein the electronics bay is formed of a top panel, bottom panel, a front panel, a back panel, and two side panels.

13. The apparatus of claim 12, wherein the opening is in the back panel of the electronics bay.

14. The apparatus of claim 13, wherein the portion of the opening is at least three edges of the opening.

15. The apparatus of claim 12, wherein the portion of the opening in the electronics bay is at least one edge of the opening.

16. A system, comprising:
    an electronics bay comprising a top panel, a bottom panel, two side panels, a front panel, and a back panel;

at least one opening in at least one of the panels of the electronics bay;

a cover adapted to cover the opening;

an extruded U-seam coupled to the opening, wherein the U-seam is adapted to receive a portion of the cover and to reduce the amount of electromagnetic interference passing through the opening; and a tab coupled to the U-seam and adapted to couple the U-seam to the opening in the electronics bay with at least one of a stake, a rivet, a bolt, and a weld.

17. The system of claim 16, wherein the extruded U-seam includes a top element and a base element coupled to said to element through a side element.

18. The system of claim 17, wherein the top element, the side element, and the base element form a gap adapted to receive the portion of the cover.

19. A method, comprising:

forming a U-seam including a top element and a base element coupled said top element through a side element, wherein the U-seam is adapted to receive a portion of a first panel and to reduce the amount of electromagnetic interference passing through the opening;

forming a tab coupled to the base element; and coupling the U-seam to an opening in an electronics bay, wherein said coupling the U-seam comprises staking portion of the U-seam to the electronics bay.

20. The method of claim 19, further comprising providing a cover, wherein a portion of the cover is adapted to be positioned in the U-seam.

21. An apparatus, comprising:

means for forming a U-seam including a top element and a base element coupled to said top element through a side element, wherein the U-seam is adapted to receive a portion of a first panel and to reduce the amount of electromagnetic interference passing through the opening;

means for forming a tab coupled to the base element; and means for coupling the U-seam to an opening in an electronics bay;

wherein said means for coupling the U-seam comprises means for staking a portion of the U-seam to the electronics bay.

22. An extruded U-seam comprising:

a top element;

a side element;

a base element coupled to said top element through said side element, wherein the top element and the base element are spaced apart to form a gap therebetween, and wherein the gap is adapted to receive a portion of a first panel and to reduce the amount of electromagnetic interference passing between the portion of the first panel and the top, the side, and the base elements;

a tab coupled to the base element; and a bay, wherein the bay is formed of a top panel, a bottom panel, a front panel, a back panel, and two side panels;

wherein the tab is adapted to couple the base element to a portion of an opening in the bay with at least one of a stake, a rivet, a bolt, and a weld;

wherein the top element, the side element, and the bare element are formed of an extruded metal.

23. A method, comprising:

forming a U-seam including a top element and a base element coupled top said top element through a side element, wherein the U-seam is adapted to receive a portion of a first panel and to reduce the amount of electromagnetic interference passing through the opening;

forming a tab coupled to the base element; and coupling the U-seam to an opening in an electronics bay;

wherein said coupling the U-seam comprises staking a portion of the U-seam to the electronics bay;

wherein said forming the U-seam comprises extruding a metal to form the U-seam.

* * * * *

UNITED STATES PATENT AND TRADEMARK OFFICE
CERTIFICATE OF CORRECTION

PATENT NO. : 6,856,512 B2
DATED : February 15, 2005
INVENTOR(S) : Gary Rumney

It is certified that error appears in the above-identified patent and that said Letters Patent is hereby corrected as shown below:

Column 6,
Line 8, please delete "and herein the gap is" and substitute -- and wherein the gap is --.
Line 54, please delete "a bolt, an a weld;" and substitute -- a bolt, and weld; --.

Column 7,
Line 12, please delete "base element coupled to said to" and substitute -- base element coupled to said top --.
Line 19, please delete "element coupled said top" and substitute -- element coupled to said top --.
Lines 26-27, please delete "comprises staking portion of the U-seam" and substitute -- comprises staking a portion of the U-seam --.

Column 8,
Lines 22-23, please delete "and the bare element are formed" and substitute -- and the base element are formed --.
Line 26, please delete "element coupled top said top" and substitute -- element coupled to said top --.

Signed and Sealed this

Sixteenth Day of August, 2005

JON W. DUDAS
*Director of the United States Patent and Trademark Office*